(12) United States Patent
Kudaev et al.

(10) Patent No.: US 10,865,947 B2
(45) Date of Patent: Dec. 15, 2020

(54) FILAMENT STRUCTURE, LIGHTING DEVICE HAVING A FILAMENT STRUCTURE, AND METHOD FOR PRODUCING A LIGHTING DEVICE HAVING A FILAMENT STRUCTURE

(71) Applicant: OSRAM Opto Semiconductors GmbH, Regensburg (DE)

(72) Inventors: Sergey Kudaev, Regensburg (DE); Farhang Ghasemi Afshar, Wenzenbach (DE); Jörg Erich Sorg, Regensburg (DE); Andreas Dobner, Wenzenbach (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/495,813

(22) PCT Filed: Mar. 20, 2018

(86) PCT No.: PCT/EP2018/057056
§ 371 (c)(1),
(2) Date: Sep. 19, 2019

(87) PCT Pub. No.: WO2018/177820
PCT Pub. Date: Oct. 4, 2018

(65) Prior Publication Data
US 2020/0096160 A1    Mar. 26, 2020

(30) Foreign Application Priority Data
Mar. 31, 2017    (DE) ........................ 10 2017 107 004

(51) Int. Cl.
*F21K 9/232*    (2016.01)
*F21K 9/90*    (2016.01)
(Continued)

(52) U.S. Cl.
CPC ................ *F21K 9/232* (2016.08); *F21K 9/90* (2013.01); *F21Y 2107/70* (2016.08); *F21Y 2115/10* (2016.08); *H01L 25/0753* (2013.01)

(58) Field of Classification Search
CPC ........ F21K 9/232; F21K 9/90; F21Y 2115/10; F21Y 2107/70; H01L 25/0753
See application file for complete search history.

(56) References Cited

U.S. PATENT DOCUMENTS 9,982,865 B2    5/2018    Ma et al.
2009/0184618 A1    7/2009    Hakata et al.
(Continued)

FOREIGN PATENT DOCUMENTS

CN    103791286 A    5/2014
CN    104406068 A    3/2015
(Continued)

*Primary Examiner* — Kevin Quarterman
(74) *Attorney, Agent, or Firm* — Slater Matsil, LLP

(57) ABSTRACT

A filament structure, a lighting device with filament structures, a method for manufacturing a lighting device and a method for manufacturing a filament structure are disclosed. In an embodiment, a filament structure includes at least two filament elements, each of the at least two filament elements comprising a leadframe element having a first end region and a second end region and a plurality of light-emitting diodes arranged on the leadframe element, at least one connecting element connecting the first end region of one of the at least two filament elements to the first end region of another of the at least two filament elements so that the at least two filament elements are connected in series and at least one further filament element including a leadframe element comprising a first end region and a second end region and a plurality of light-emitting diodes, wherein the leadframe element of the further filament element is a part of an one-piece leadframe, wherein the first end region of the leadframe element of the further filament element is con-
(Continued)

nected via the connecting element to the first end regions of the at least two filament elements and wherein the connecting element is shaped and/or bendable such that each of the filament elements of the filament structure extends along a lateral surface of an imaginary cone or pyramid.

15 Claims, 7 Drawing Sheets

(51) Int. Cl.
     *F21Y 115/10*      (2016.01)
     *F21Y 107/70*      (2016.01)
     *H01L 25/075*      (2006.01)

(56) References Cited

U.S. PATENT DOCUMENTS

| | | | |
|---|---|---|---|
| 2014/0375201 A1* | 12/2014 | Su | F21V 29/83 |
| | | | 313/35 |
| 2015/0323139 A1 | 11/2015 | Tseng | |
| 2016/0178133 A1* | 6/2016 | Kong | F21K 9/232 |
| | | | 362/382 |
| 2017/0051878 A1* | 2/2017 | Jiang | F21K 9/64 |
| 2017/0084809 A1* | 3/2017 | Jiang | H01L 33/56 |
| 2017/0130906 A1* | 5/2017 | Jiang | F21K 9/232 |

FOREIGN PATENT DOCUMENTS

| | | |
|---|---|---|
| CN | 105387355 A | 3/2016 |
| CN | 205424484 U | 8/2016 |
| CN | 205447330 U | 8/2016 |
| CN | 205824949 U | 12/2016 |
| CN | 106523946 A | 3/2017 |
| EP | 3073175 A1 | 9/2016 |

* cited by examiner

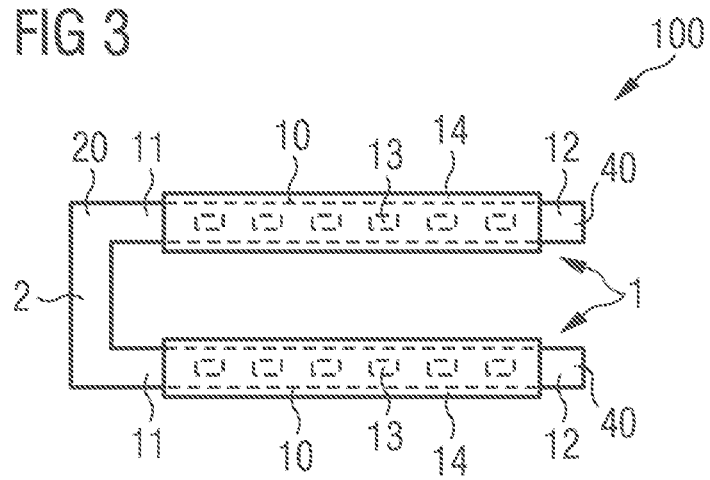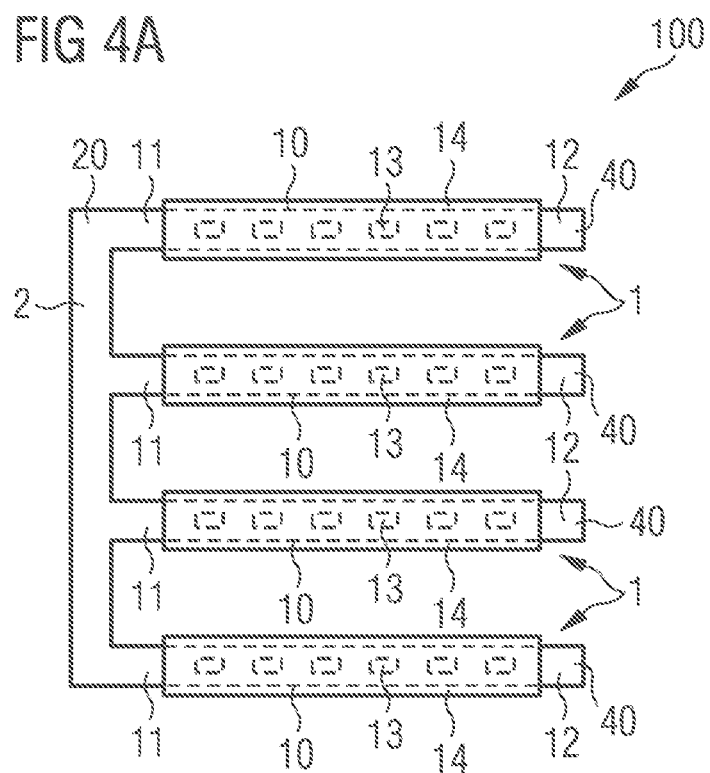

FILAMENT STRUCTURE, LIGHTING DEVICE HAVING A FILAMENT STRUCTURE, AND METHOD FOR PRODUCING A LIGHTING DEVICE HAVING A FILAMENT STRUCTURE

This patent application is a national phase filing under section 371 of PCT/EP2018/057056, filed Mar. 20, 2018, which claims the priority of German patent application 102017107004.4, filed Mar. 31, 2017, each of which is incorporated herein by reference in its entirety.

TECHNICAL FIELD

A filament structure, a lighting device with at least one filament structure and a method for manufacturing a lighting device with at least one filament structure are specified.

BACKGROUND

So-called retrofit light sources are known which, like conventional lamps, can be mounted in conventional sockets but which use light-emitting diodes as light sources. Often, an objective in the design and manufacture of such retrofit lamps is to reproduce the appearance of classic lamps while exploiting the energy efficiency of the light-emitting diodes.

SUMMARY OF THE INVENTION

Embodiments provide a filament structure for a lighting device. Further embodiments are to provide a lighting device with at least one filament structure and a method for manufacturing a lighting device with at least one filament structure.

According to at least one embodiment, a filament structure comprises at least two filament elements, each of the filament elements comprising a plurality of light-emitting diodes. According to at least one further embodiment, a lighting device comprises a filament structure. According to at least one further embodiment, a filament structure is used in a method for manufacturing a lighting device. The following embodiments and features equally apply to the filament structure, the lighting device and the method for manufacturing the lighting device.

According to a further embodiment, the filament structure has a one-piece leadframe. By "leadframe" here and in the following a metallic carrier is denoted which can be produced by cutting, in particular by punching, etching and/or laser cutting, of a metallic sheet, a metallic foil or a metallic strip. The leadframe can, for example, comprise or be made of copper, brass, bronze or stainless steel with material thicknesses greater than or equal to 0.01 mm and less than or equal to 1 mm. That the leadframe of the filament structure is a one-piece leadframe means in particular that regions of the leadframe are not produced and fitted with light-emitting diodes individually from each other and subsequently joined together, but that all regions of the leadframe of the filament structure are preferably produced from a continuous sheet or film or strip by cutting to size. Interruptions in the leadframe, held together by dielectric connectors which can, for example, be clamped or essentially preferentially incorporated by a molding process immediately after cutting, can electrically insulate individual parts of the leadframe from each other. A leadframe having such interruptions and dielectric connectors introduced during the manufacture of the leadframe, in particular prior to further use of the leadframe, still falls under the term "one-piece". The one-piece leadframe is manufactured and finished, in particular with regard to its structure described below, with filament elements and at least one connecting element and thereby forms, including dielectric connectors, a coherent, self-supporting component on which only thereafter light-emitting diodes are mounted and wavelength conversion elements are applied to produce the filament elements described below.

According to a further embodiment, the filament structure comprises at least two filament elements, each of the filament elements comprising a leadframe element with a first end region and a second end region, on which leadframe element a plurality of light-emitting diodes is arranged. The leadframe elements of the filament elements are parts of the one-piece leadframe, which, as described above, means in particular that the filament elements, possibly with interruptions and dielectric connectors, are manufactured first as parts of the one-piece leadframe and are fitted with the light-emitting diodes only after the leadframe has been manufactured. Each of the leadframe elements can have an elongated shape, in particular a strip shape, which extends from the first end region to the second end region. The filament structure further comprises a connecting element which is also part of the one-piece leadframe and which connects the first end region of one of the at least two filament elements to the first end region of another of the at least two filament elements, so that the at least two filament elements are interconnected via the connecting element and, optionally via suitable electrically conductive structures, are connected in series. In other words, the leadframe elements of all filament elements and at least one connecting element are designed as a previously described one-piece leadframe.

In particular, the leadframe elements can form carriers for the light-emitting diodes of each of the filament elements. For example, each of the filament elements can have a number of greater than or equal to 10 or greater than or equal to 20 or greater than or equal to 25 and less than or equal to 40 or less than or equal to 30 light-emitting diodes mounted and electrically connected on the respective leadframe element. For this purpose, the leadframe elements can also have electrically conductive structures such as conductor tracks and/or insulating layers and/or the interruptions described above, which can be used for mounting, electrical connection and mutual electrical insulation of light-emitting diodes. For example, the light-emitting diodes can be soldered onto corresponding regions and interconnected by conductor paths and/or wire connections. Preferably, each of the filament elements comprises the light-emitting diodes in a series circuit. This can result, for the operation of the light-emitting diodes, in a forward voltage of particularly preferably several 10 volts for each of the filament elements, for example, in the range from about 60 V to about 70 V. A higher operating voltage can be achieved by connecting at least two filament elements in series. This allows a higher efficiency to be achieved, since a driver to which the filament structure can be electrically connected for operation can be operated at a working voltage closer to the mains voltage. In addition, as described in more detail below, the filament structure can have more than two filament elements, which can be formed as previously described and which can be connected in series or partially in parallel by the one-piece leadframe.

In particular, the light-emitting diodes can each be embodied as light-emitting diode chips and have a semiconductor layer sequence with an active layer for generating light, which is grown on a growth substrate by means of an epitaxial process, for example, by means of metalorganic vapor phase epitaxy (MOVPE) or molecular beam epitaxy (MBE). Depending on the wavelength to be emitted, the light-emitting diode chips can have a semiconductor layer sequence based on different semiconductor material systems. For example, a semiconductor layer sequence based on $In_xGa_yAl_{1-x-y}As$ is suitable for long-wave, infrared to red radiation, while, for example, a semiconductor layer sequence based on $In_xGa_yAl_{1-x-y}P$ is suitable for red to yellow radiation, and, for example, a semiconductor layer sequence based on $In_xGa_yAl_{1-x-y}N$ is suitable for short-wave visible radiation, i.e., in particular for green to blue radiation, and/or for UV radiation, wherein in each case $0 \leq x \leq 1$, $0 \leq y \leq 1$ and $x+y \leq 1$ apply.

Each of the filament elements can comprise, over the light-emitting diodes, at least one wavelength conversion element, for example, in the form of a common covering of the light-emitting diodes, comprising one or more wavelength conversion materials capable of absorbing light from light-emitting diodes and re-emitting it at a different wavelength, so that during operation each of the filament elements can radiate light with a desired color impression due to a suitable combination of light-emitting diodes and wavelength conversion materials in the wavelength conversion element. In particular, the light-emitting diodes and the wavelength conversion element can be selected so that the filament elements can emit white light during operation. For example, blue emitting light-emitting diodes can be used in conjunction with a wavelength conversion element that converts at least part of the blue light produced by the light-emitting diodes into yellow and/or orange and/or green and/or red light. For example, the wavelength conversion element can comprise one or more of the following wavelength conversion materials: Garnets of rare earths and of alkaline earth metals, nitrides, nitridosilicates, siones, sialons, aluminates, oxides, halophosphates, orthosilicates, sulfides, vanadates and chlorosilicates. For example, one or more wavelength conversion materials can be selected from $Ce^{3+}$-doped garnets such as LuAG and YAG and/or from $Eu^{2+}$-doped red phosphors. Further, a wavelength conversion material can additionally or alternatively comprise an organic material which can be selected from a group comprising perylenes, benzopyrenes, coumarins, rhodamines and azo dyes. Further, the wavelength conversion element can comprise a transparent matrix material which surrounds or contains the wavelength conversion material(s) or which is chemically bonded to the wavelength conversion material(s). The transparent matrix material can comprise siloxanes, in particular silicones, epoxides, acrylates, methyl methacrylates, imides, carbonates, olefins, styrenes, urethanes or derivatives thereof in the form of monomers, oligomers or polymers, as well as mixtures, copolymers or compounds thereof. For example, the matrix material can comprise or be one or more materials selected from silicone resin, epoxy resin, polymethyl methacrylate (PMMA), polystyrene, polycarbonate, polyacrylate, polyurethane and compounds and mixtures thereof.

According to a further embodiment, the leadframe elements have a reflective surface. In particular, it can be advantageous if the leadframe elements and in particular the leadframe have a highly reflective surface, in other words a surface that is as well reflective as possible, so that as much light as possible that is radiated by the light-emitting diodes and the wavelength conversion element in the direction of the leadframe elements can be reflected and radiated to the outside. The leadframe elements and in particular the leadframe can have a reflective material for this purpose, for example, selected from aluminum and/or silver, for example, in the form of a suitable coating. Furthermore, the leadframe elements can have openings through which light emitted by the light-emitting diodes can pass from the side on which the light-emitting diodes are mounted to the opposite side. Thus, the part of the wavelength conversion element that is located on the side facing away from the light-emitting diodes as seen from the leadframe can also be excited by the light of the light-emitting diodes, so that it can be prevented that the wavelength conversion element shines darker on the side facing away from the light-emitting diodes than on the side with the light-emitting diodes.

According to a further embodiment, the connecting element is shaped and/or bendable such that the filament structure is shaped or can be bent in such way that each of the filament elements of the filament structure extends along a lateral surface of an imaginary cone or pyramid. In particular, the connecting element can face an apex of the cone or pyramid. In other words, the filament structure can be shaped or formable so as to give a shape which can be applied to an imaginary cone or pyramid so that the at least one connecting element and thus the first end regions of the leadframe elements face the apex of the imaginary cone or pyramid and the second end regions face the base of the imaginary cone or pyramid. In this form, in a lighting device the filament structure can be soldered to an electrical connection of the lighting device, i.e., in particular to one or two lead wires.

According to a further embodiment, the filament structure comprises at least one further filament element comprising a leadframe element having a first end region and a second end region and having a plurality of light-emitting diodes, wherein the leadframe element of the further filament element is a part of the one-piece leadframe and the first end region of the leadframe element of the further filament element is connected to the first end regions of the at least two filament elements via the connecting element. Together with the connecting element, the at least two filament elements and the further filament element can thus have a comb-like shape, for example. In particular, the further filament element can be connected in series with one of the at least two filament elements. Furthermore, the further filament element can be connected in parallel with another of the at least two filament elements. For this purpose, one of the at least two filament elements and the further filament element can be electrically conductively connected to one another with the second end regions. For example, second end regions can be connected by a further connecting element of the one-piece leadframe. Alternatively, the second end regions can be connected by a connector, which is manufactured separately from the one-piece leadframe. The connector can comprise a leadframe or be formed by a leadframe. Furthermore, the connector can be stretchable in at least one direction. For this purpose, the connector can comprise a stretch-lattice. Furthermore, each of the at least two filament elements can be connected in parallel with at least one further filament element in the manner described above.

In the manner described above for manufacturing the lighting device at least one filament structure can be provided by manufacturing the one-piece leadframe, mounting and electrically connecting light-emitting diodes to the leadframe elements of the one-piece leadframe, and optionally applying wavelength conversion elements to the light-emitting diodes. The filament structure, in particular at least the at least one connecting element, can be bent and/or shaped such that each of the filament elements of the filament structure extends, as previously described, along a lateral surface of an imaginary cone or pyramid. Then at least one filament structure can be connected to at least one electrical lead of the electrical connection of the lighting device, for example, by soldering. The resulting lighting device has accordingly at least one filament structure and an electrical connection by means of which the filament structure can be connected to an external electrical energy source, i.e., a current and/or voltage source, at least the connecting element of the at least one filament structure being shaped and/or bent in such a way that each of the filament elements of the filament structure extends along a lateral surface of an imaginary cone or pyramid, the imaginary cone or pyramid having a base and an apex, the base facing the electrical connection and the apex facing away from the electrical connection.

The electrical connection of the lighting device can, for example, be embodied in such a way that the lighting device can be mounted and electrically connected in a conventional lamp socket. The electrical connection canthus comprise or form a conventional lamp socket, which may, for example, have a conventional crimp base with gas-tight wire feedthrough and lead wires for electrical connection of the filament structure. Accordingly, the lighting device can be a so-called retrofit lamp in which at least one filament structure is arranged in a transparent glass or plastic bulb.

According to a further embodiment, the filament structure has at least two connection regions between which a current path runs through at least two filament elements during operation of the filament structure. A connection region can be formed by a region of the one-piece leadframe or by a region of a previously described connector that can be used to connect two end regions of filament elements together. If the filament structure has more than two filament elements, the current path, possibly branched due to parallel connected filament elements, also runs through all filament elements. The filament structure particularly preferably has exactly two connection regions, via which the filament structure can be electrically connected, so that all filament elements are arranged along the current path between exactly two connection regions. The connection regions can be arranged especially on the side of the second end regions of the filament elements. In other words, during operation of the filament structure, the operating current flows into the filament structure via a connection region and the second end region of at least one filament element and flows out of the filament structure again via the second end region of at least one other filament element and a further connection region.

According to a further embodiment, the lighting device comprises at least two filament structures which are embodied according to the previous description and which are connected in series. For this purpose, the lighting device can have a suitable connector which can be embodied, for example, as the connector described above for the electrical connection of second end regions and via which the at least two filament structures are connected to one another in series. The structure formed by at least two filament structures can be connected electrically to one electrical connection of the lighting device via exactly two connection regions.

In comparison to the filament structure described here, which forms a composite of several filament elements, conventional filament lamps only use individual filaments that form individual lighting threads. Support frames are used to position these in a glass bulb of a lamp. The filaments are soldered individually to these and, for contacting, to wire feedthroughs in a crimp base. As a result of the support frames, the individual filaments at the tip of the bulb have a relatively large distance from each other, which in turn results in a relatively small angle to the lamp axis, since the distance between the filaments at the underside of the bulb is determined by the socket in which the bulb is mounted. In other words, the filaments attached in the conventional way usually run essentially along the axis of the lamp. This is why the amount of light that can be emitted in the direction of the lamp axis is small with conventional filament lamps, which differ in their radiation characteristics from conventional incandescent lamps that emit light almost uniformly in all directions. The support frame and a raised crimp base furthermore form shadow-throwing elements in the bulb, which means that conventional filament lamps often show an alternating bright-dark radiation pattern. In addition, conventional filament lamps with individually attached filaments are costly and time-consuming to produce, as each filament has to be soldered manually to two locations. The filament structure described here, on the other hand, makes it possible to build all filament elements as composite on a common leadframe, to bend and/or shape it in the desired way after completion of the filament elements and then solder it as a whole, preferably using only two lead wires, so that the individual filament elements do not have to be soldered individually and no support frame is necessary.

BRIEF DESCRIPTION OF THE DRAWINGS

Further advantages, advantageous embodiments and further developments are revealed by the embodiments described below in connection with the figures, in which:

FIG. 3 shows a schematic illustration of a filament structure according to a further embodiment;

FIGS. 4A to 4E show schematic illustrations of a filament structure and method steps for manufacturing a lighting device according to a further embodiment;

Figure 1:
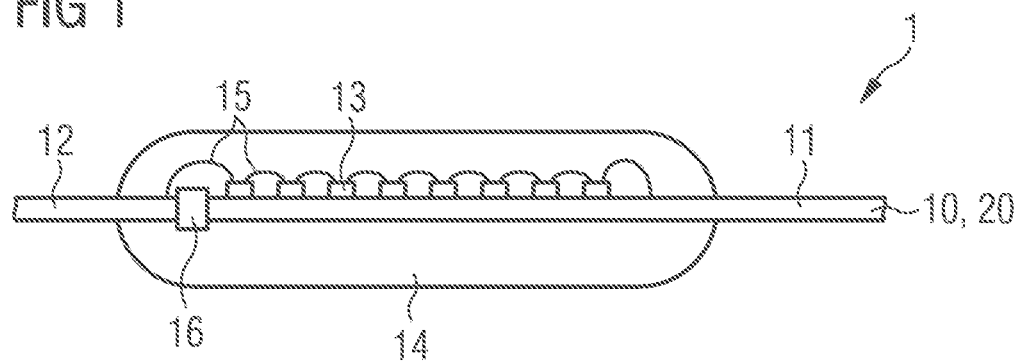
FIG. 1 shows a schematic illustration of a filament element according to an embodiment.

In the embodiments and figures, identical, similar or identically acting elements are provided in each case with the same reference numerals. The elements illustrated and their size ratios to one another should not be regarded as being to scale, but rather individual elements, such as, for example, layers, components, devices and regions, can have been made exaggeratedly large to illustrate them better and/or to aid comprehension.

DETAILED DESCRIPTION OF ILLUSTRATIVE EMBODIMENTS

FIG. 1 shows a schematic cross-section of a filament element 1 for a filament structure according to an embodiment. The filament element 1 has a leadframe element 10 which is part of a one-piece leadframe 20 made by cutting a metallic sheet, foil or strip to size. The leadframe 20 can, for example, be made of copper, brass, bronze or stainless steel with material thicknesses greater than or equal to 0.01 mm and less than or equal to 1 mm.

On the leadframe element 10, between a first end region 11 and a second end region 12, a plurality of light-emitting diodes 13 is arranged, which can be mounted, for example, by means of a so-called "chip-on-board" technology and which are encased with a wavelength conversion element 14. In the embodiment shown, the light-emitting diodes 13 are connected in series, i.e., the anode of a light-emitting diode with the cathode of an adjacent light-emitting diode, by wire connections 15 in the form of bond wires. Alternatively or additionally, the leadframe element 10 can also have electrically conductive structures such as conductor tracks and insulating layers, which are not shown for the sake of clarity and which can be used for mounting and electrical connection as well as for mutual electrical insulation of light-emitting diodes. The light-emitting diodes can, for example, be soldered or glued to corresponding regions and are interconnected by the wire connections 15 as described above. The first and the last light-emitting diode 13 are directly connected to the leadframe element 10 in an electrically conductive way by wire connection 15, so that the described series connection can be operated with an electrical contacting of the end regions 11, 12. To avoid a short-circuit between the first and second end regions 11, 12, the filament element 1 has a dielectric connector 16 which electrically interrupts the leadframe 20. The dielectric connector 16 is attached between the end regions 11, 12 during the manufacture of the leadframe element 10 and thus forms part of the one-piece leadframe 20 as described in the general part. The direction of the operating current is determined by the formation and electrical connection of the light-emitting diodes 13. In other words, by connecting the light-emitting diodes 13, one of the end regions 11 is defined as the anode connection region and the other of the end regions 12 as the cathode connection region.

For example, the filament element 10 can have a number greater than or equal to 10 or greater than or equal to 20 or greater than or equal to 25 and less than or equal to 40 or less than or equal to 30 light-emitting diodes 13 mounted on the respective leadframe element and electrically connected. For the sake of clarity, fewer light-emitting diodes are shown in FIG. 1 and in the other figures. The light-emitting diodes 13 can all emit the same or different light during operation.

The wavelength conversion element 14 is applied over the light-emitting diodes 13 in the form of a common covering of the light-emitting diodes 13 and the leadframe element 10 between the end regions 11, 12. The dielectric connector 16 and the wire connections 15 are also encased by the wavelength conversion element 14. The wavelength conversion element 14 can be applied by casting, injection or a molding process. The wavelength conversion element 14, which can, for example, only be applied to the side of the leadframe element 10 on which the light-emitting diodes 13 are mounted, comprises one or more wavelength conversion materials and is intended and embodied to absorb light emitted by light-emitting diodes 13 and to re-emit light at a different wavelength, so that, in operation, light with a desired color impression can be emitted by a suitable combination of light-emitting diodes 13 and wavelength conversion materials in the wavelength conversion element 14. In particular, the light-emitting diodes 13 and the wavelength conversion element 14 can be selected so that white light can be emitted during operation. For example, blue light-emitting diodes in the form of light-emitting diode chips based on InAlGaN in combination with a wavelength conversion element that contains a wavelength conversion material based on a garnet such as YAG:Ce in a transparent matrix material such as silicone are suitable for this purpose. Alternatively or additionally, other materials mentioned above in the general part are also possible.

In order to achieve the most efficient light emission possible, the leadframe element 10 and, in particular, the leadframe 20 can have a highly reflective surface, for example, in the form of a suitable coating, such as a metallic layer with or made of aluminum and/or silver, so that as little light as possible is absorbed by the leadframe material. Furthermore, the leadframe element 10 can have apertures which reach through the leadframe material so that light emitted by the light-emitting diodes 13 during operation also reaches the side of the leadframe remote from the light-emitting diodes 13 and can also excite the part of the wavelength conversion element 14 disposed there. The reflective surface and the openings in the leadframe are not shown for the sake of clarity.

Figure 2A:
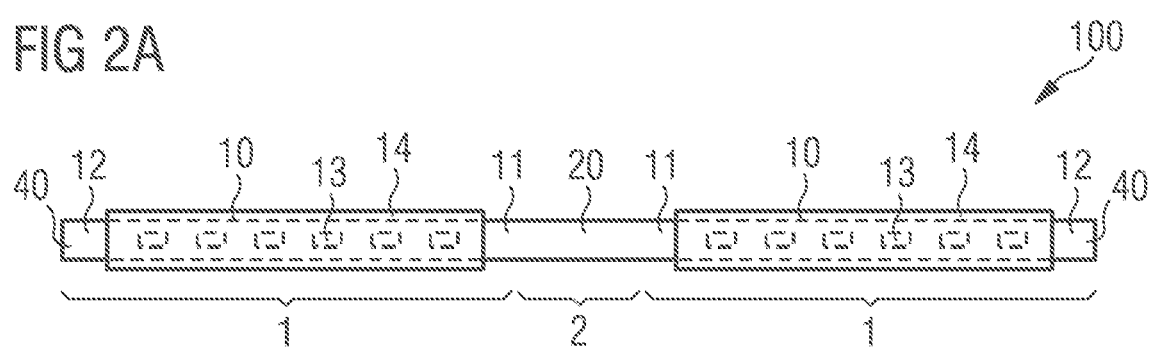
FIGS. 2A and 2B show schematic illustrations of a filament structure according to a further embodiment.

FIG. 2A shows in a schematic top view a filament structure 100 according to a further embodiment, which has two filament elements 1, each of which can be formed according to the embodiment of FIG. 1. For better clarity, FIG. 2A and the following figures usually only show the leadframe elements, some light-emitting diodes and, if applicable, wavelength conversion elements and/or dielectric connectors. In particular, the filament elements 1 can both be embodied similarly and emit the same light during operation.

The leadframe elements 10 of the filament elements 1 together with a connecting element 2 form a one-piece leadframe 20. In particular, the two first end regions 11 of the leadframe elements 10 of the two filament elements 1 are connected to each other via the connecting element 2. The two filament elements 1 are connected in series with each other by the connecting element 2, i.e., if necessary also by suitable electrically conductive measures in or on the leadframe 20. The two second end regions 12 of the leadframe elements 10 of the filament elements 1 can form connection regions 40, via which the filament structure 100 can be connected to an external electrical energy source, i.e., an external power and/or voltage supply, and operated. For example, the filament structure 100 can be soldered to electrical leads of a lighting device.

Figure 2B:
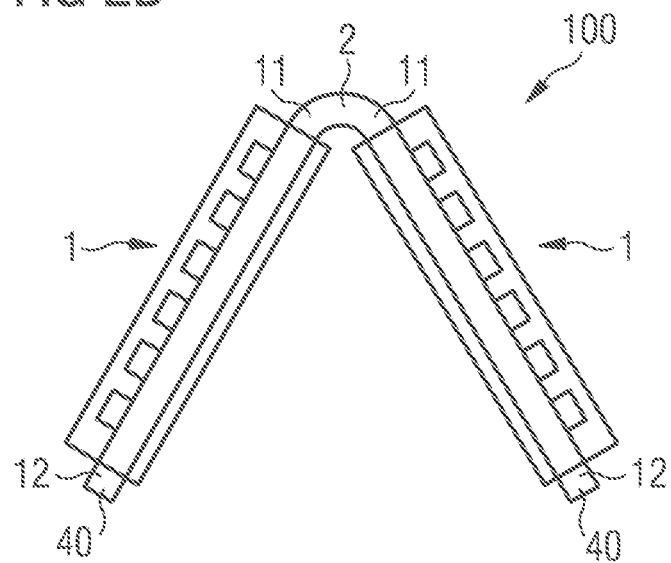

For the manufacture of the filament structure 100, the one-piece leadframe 20 is produced with the leadframe elements 10 and the connecting element 2, then equipped with the light-emitting diodes 13 and then provided with the wavelength conversion elements 14 to complete the filament elements 1. In the embodiment shown, the filament elements 1 and the connecting element 2 together form a strip-shaped filament structure 100. The connecting element 2 is bendable such that the filament structure 100 can be shaped such that each of the filament elements 1 runs along a surface of an imaginary cone or pyramid. In particular, the first end regions 11 and the connecting element 2 are arranged near the apex of the imaginary cone or pyramid, while the second end regions 12 and thus the connecting portions 40 of the filament structure 100 are arranged near the base of the imaginary cone or pyramid. An example configuration for this is shown in FIG. 2B.

In the following figures further embodiments of filament structures are shown, which are further developments and modifications of the embodiments shown in FIGS. 1, 2A and 2B. The following description with regard to the filament structures is therefore essentially limited to the differences compared to the previous embodiments.

FIG. 3 shows a further embodiment of a filament structure 100, wherein the connecting element 2 forms a U-shape or comb shape with the leadframe elements 10 of the filament elements 1. By suitable bending of the connecting element 2, as in the case of the filament structure shown in FIGS. 2A and 2B, the filament structure 100 shown in FIG. 3 can also be shaped by bending the connecting element 2 in such a way that each of the filament elements 1 runs along a lateral surface of an imaginary cone or pyramid.

FIGS. 4A to 4E show further embodiments of filament structures 100 and method steps for manufacturing a lighting device 1000 with a filament structure 100. Instead of the now described filament structures 100, one of the filament structures described in the other embodiments can also be used in the lighting device.

FIG. 4A shows a filament structure 100 which, compared to the filament structure shown in FIGS. 2A and 2B, has purely exemplary two further filament elements 1. All filament elements 1 are connected to the first end regions 11 of the respective leadframe element 10 by means of the connecting element 2, so that the filament structure 100 is based on the shown one-piece leadframe 20, which has a comb-like shape.

Figure 4B:
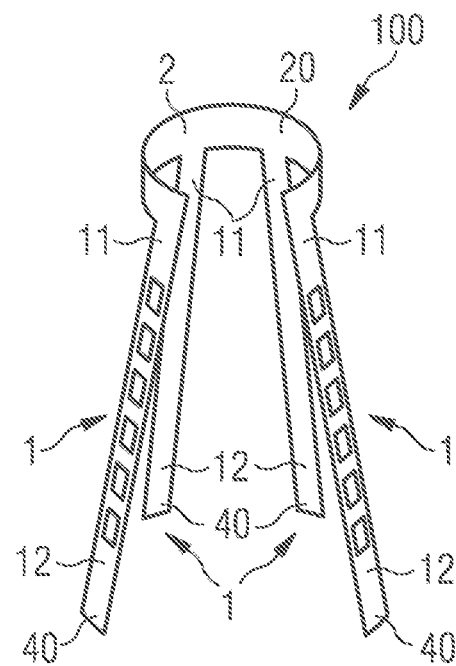

By bending and/or shaping the connecting element 2, the filament structure 100 can be formed into a shape in which each of the filament elements 1 in turn extends along the lateral surface of an imaginary cone or pyramid, wherein the connecting element 2 and the first end regions 11 are located near the cone or pyramid apex and the second end regions 12 are located near the cone or pyramid base area as shown in FIG. 4B. In FIG. 4B as well as in FIGS. 4C and 4E the wavelength conversion elements of the filament elements 1 are not shown for the sake of clarity.

The second end regions 12 of the filament elements 1 can form connection regions 40, which can be soldered to electrical supply lines of a lighting device, wherein the supply lines are particularly preferably embodied in such a way that two filament elements 1 are connected parallel to each other and the two parallel circuits are connected in series with each other. As described in connection with FIG. 1, the assembly and wiring of the light-emitting diodes can determine the current direction with which the individual filament elements 1 can be operated, so that it can be determined which filament elements 1 can be connected in parallel.

Figure 4C:
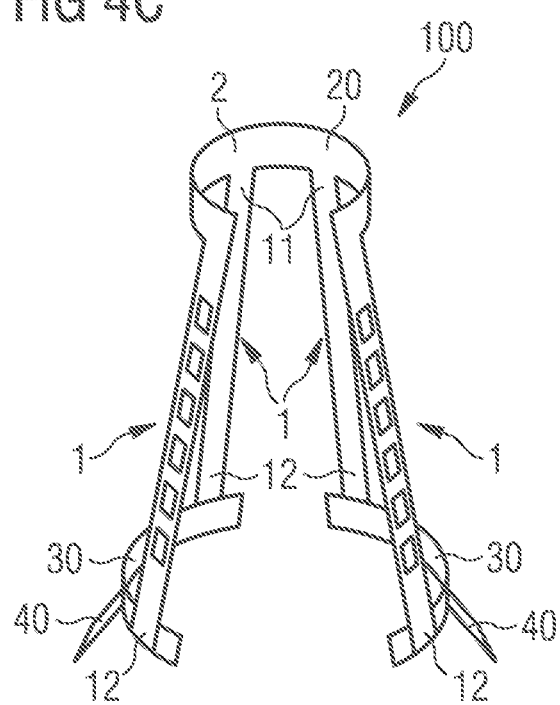
Figure 4D:
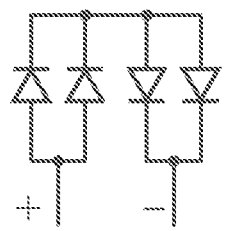

FIG. 4C shows a modification of the embodiment of FIG. 4B, in which a first filament element 1 and a further filament element 1 are connected to one another by means of a connector 30 and a second filament element 1 and a further filament element 1 are connected to one another, in each case with the second end regions 12, by means of a further connector 30, so that the filament structure 100 already has two pairs, which are connected to one another in series, with in each case two filament elements 1 connected in parallel to one another. As described above, the light-emitting diodes of the respective filament elements 1 are mounted and interconnected in a suitable manner. In the embodiment shown, the connectors 30 are formed by leadframes which are manufactured separately from the one-piece leadframe 20 and which can be connected to the second end regions 12 of the filament structure 100 by soldering, for example. Each of the connectors 30 has a connection region 40, wherein the filament structure 100 of FIG. 4C can be electrically connected by means of exactly two connection regions 40, so that all filament elements 1 of the filament structure 100 are arranged, in operation, along a current path between exactly two connection regions 40. FIG. 4D shows an equivalent circuit diagram corresponding to the wiring of the filament elements, with each of the filament elements indicated by a diode circuit symbol.

Figure 4E:
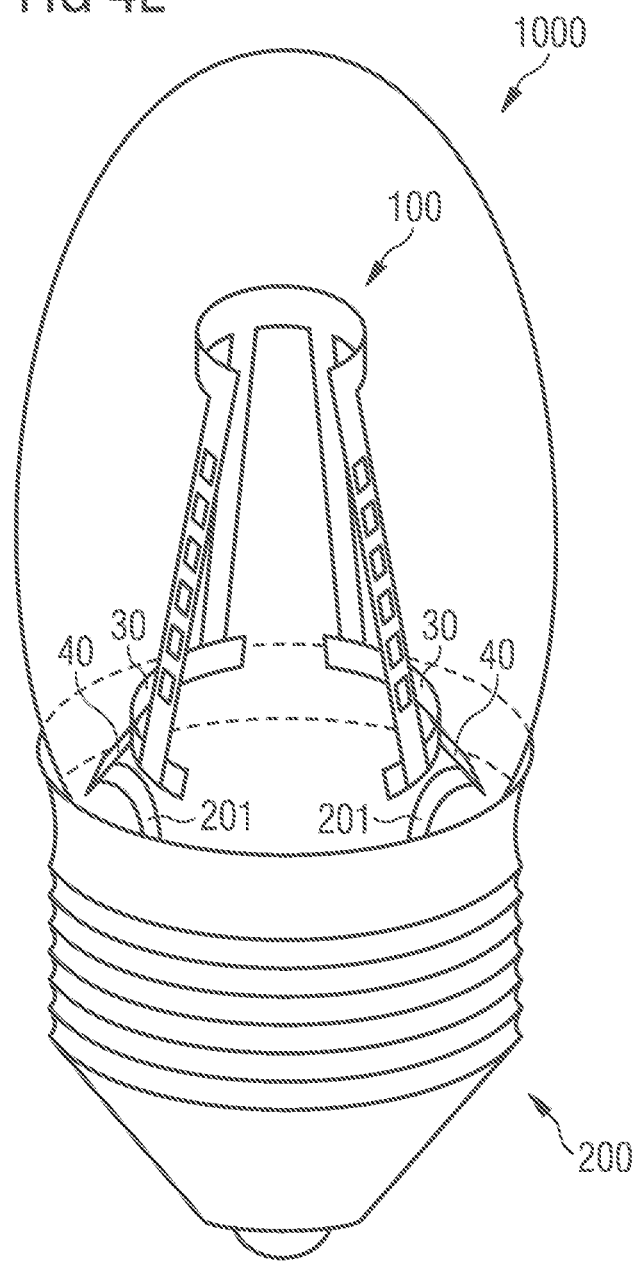

FIG. 4E shows a lighting device 1000 with an electrical connection 200 and electrical leads 201 in the form of lead wires with different electrical polarities, i.e., "+" and "−", to which the connection regions 40 of the filament structure 100 of FIG. 4C are soldered. The filament structure 100 can be connected to an external electrical energy source, i.e., a current and/or voltage source, by means of the electrical connection 200. The electrical connection 200, for example, can be embodied in such a way that the lighting device 1000 can be mounted and electrically connected in a conventional lamp socket. The electrical connection 200 can thus comprise or form a conventional lamp base, which can have a conventional crimp base with gas-tight wire feed-through inside the lighting device 1000, for example, as well as lead-in wires 201 for the electrical connection of the filament structure 100. Accordingly, the lighting device 1000 can be particularly preferred a so-called retrofit lamp.

The filament structure 100 is located in a transparent bulb made of glass or plastic and can be held purely by attachment to the leads 201 without an additional support frame, wherein at least the connecting element of the filament structure 100 is shaped and/or bent such that each of the filament elements of the filament structure 100 extends along a lateral surface of an imaginary cone or pyramid, the imaginary cone or pyramid having a base area and an apex, the base area facing the electrical connection 200 and the apex facing away from the electrical connection 200. As a consequence, a relatively large angle between the filament elements and the lamp axis can be achieved so that the lighting device 1000 can emit light not only laterally but also in the direction facing away from the electrical connection, i.e., along the lamp axis in the direction of the bulb top.

Figure 5A:
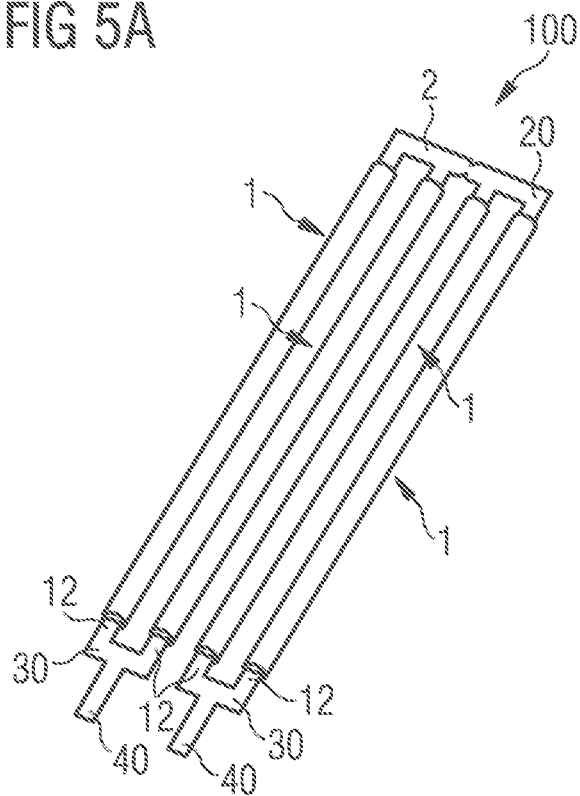
FIGS. 5A to 5D show schematic illustrations of a filament structure according to a further embodiment.
Figure 5B:
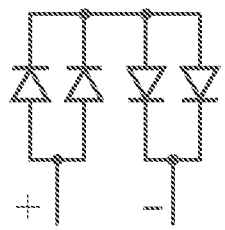
Figure 5C:
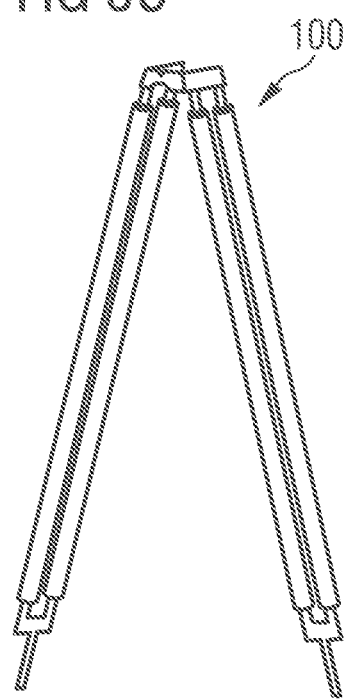
Figure 5D:
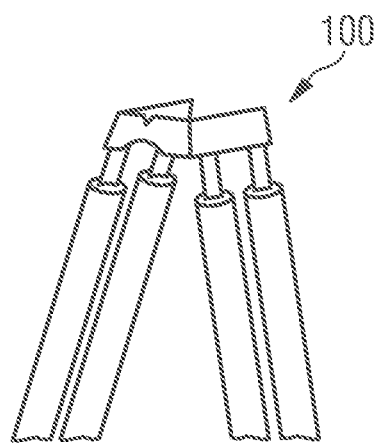

FIGS. 5A to 5D show schematic views of a filament structure 100 according to a further embodiment in which, compared to the previous embodiment, the filament elements 1 connected in parallel are connected to each other at the second end regions 12, respectively, by means of a connector 30, which is formed by a further connecting element of the one-piece leadframe 20, so that the filament elements 1 connected in parallel are firmly connected to each other at the second end regions 12. FIG. 5A shows the filament structure 100 after manufacture. FIG. 5B shows an equivalent circuit diagram corresponding to the wiring of the filament elements, with each of the filament elements indicated by a diode circuit symbol. In FIGS. 5C and 5D the filament structure 100 is shown as a whole and in a section after bending the connecting element 2. By means of the shown notch of the leadframe 20 at the connecting element 2 a desired bending is facilitated.

Figure 6A:
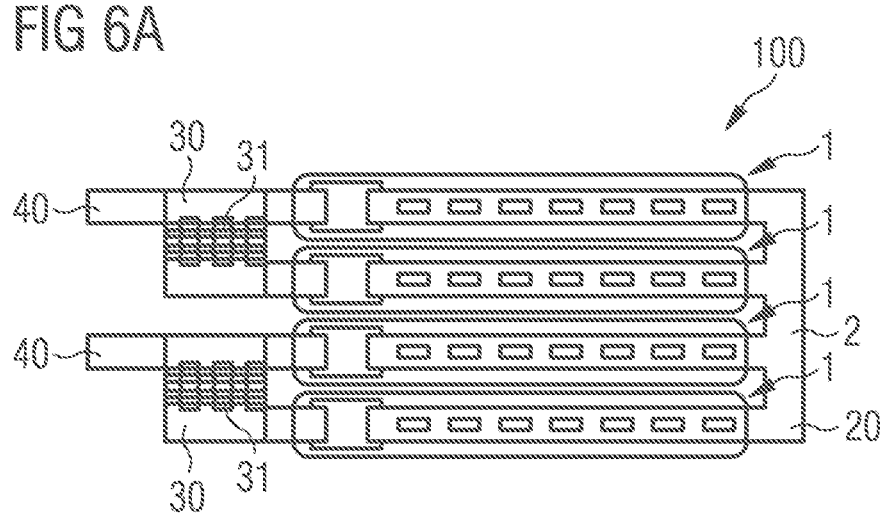
FIGS. 6A and 6B show schematic illustrations of a filament structure according to a further embodiment.
Figure 6B:
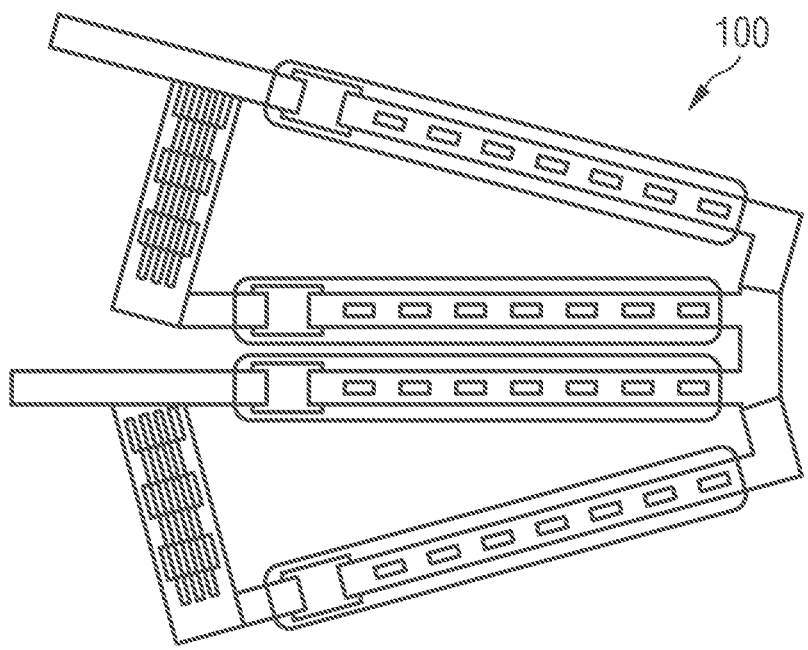

FIGS. 6A and 6B show a filament structure 100 according to a further embodiment, in which the connectors 30 are stretchable in at least one direction. For that, the connectors 30 comprise a stretch-lattice 31, which is shown in FIG. 6A after manufacture and in FIG. 6B after the stretching deformation. After the production of the filament structure 100, i.e., after the production of the one-piece leadframe 20 and the connection of the second end regions 12 by means of the connectors 30, in the embodiment shown by suitable clamping connections, the subsequent chip assembly and the subsequent application of the wavelength conversion elements, the stretch-lattices 31 in the connectors 30 can be elongated and the connecting element 2 can be bent in order to achieve the desired cone or pyramid shape. In a lighting device, the filament structure 100 can thus be configured similarly to the filament structure shown in FIGS. 4C and 4E, wherein the connectors 30 can already be integrated in unbent form during the manufacture of the filament structure 100.

Figure 7A:
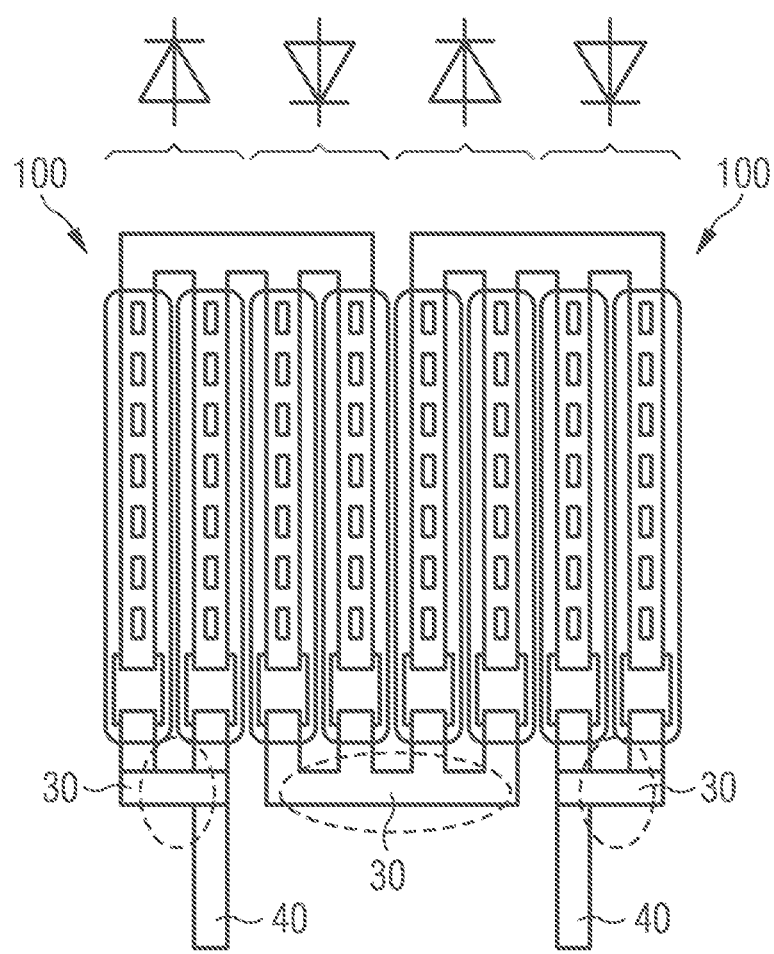
FIGS. 7A and 7B show schematic illustrations of filament structures according to a further embodiment.

FIG. 7A shows a further embodiment with two filament structures 100 which are embodied according to the previous description and which are connected in series. A suitable connector 30, which in the illustration shown is arranged in the middle, is provided for this purpose, which connector 30 can be embodied, for example, like one of the connectors described above, for the electrical connection of second end regions 12, and via which the at least two filament structures 100 are connected to one another in series. At the same time, the middle connector 30 is used for parallel connection of two filament elements 1 of each of the two filament structures 100.

Figure 7B:
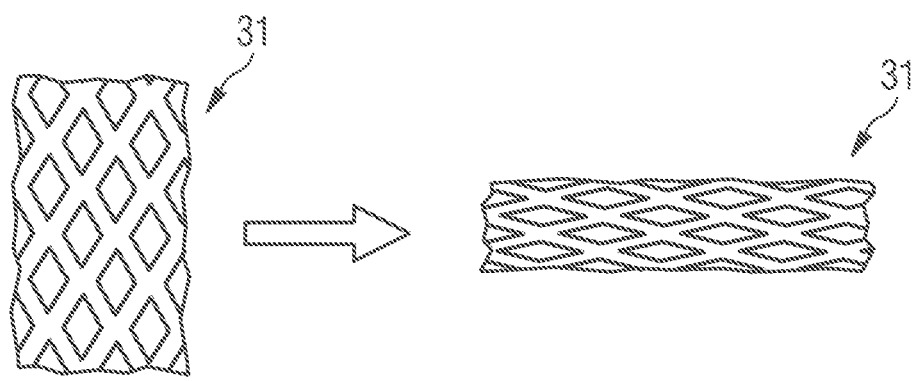

As shown, the structure formed by the two filament structures 100 can particularly preferred further be connected electrically to an electrical connection of a lighting device via exactly two connection regions 40 at two further connectors 30. In the regions indicated by the dashed lines, the connectors 30 can be rigid, for example, as in the embodiment of FIG. 5A to 5D, or with a stretch-lattice, for example, as in the embodiment of FIGS. 6A and 6B. Sectional views of a corresponding stretch-lattice 31 in an unstretched and in a stretched state are shown in FIG. 7B. As described in connection with the previous embodiments, the structure formed by several filament structures 100 can also be brought into the desired cone or pyramid shape by bending and/or shaping at least the respective connecting element of the filament structures 100.

The described filament structures allow a more favorable manufacture compared to conventional filament lamps, since no support frames are necessary for holding individual filaments and the number of required solder joints can be reduced to at least half, since a maximum of one solder joint is required per filament element. The entire filament structure can preferably be soldered to lead wires using only two solder joints. Furthermore, the radiation characteristic of a lighting device with a filament structure described here can be more similar to that of a conventional light bulb than in the case of a conventional filament lamp, as the filament elements on the side of the first end regions can be close to each other. This allows the filament elements to be tilted more towards the lamp axis than individual filaments in a support frame of a conventional filament lamp, which increases the amount of light emitted in the direction of the lamp axis.

The shown filament structures are not limited to the embodiments of the figures, especially with regard to the number of filament elements. Further, filament structures are also possible without connection at the second end regions, with fixed connections at the second end regions or with stretchable connections at the second end regions, for example, with at least two filament elements in series and/or with two, three or four or more filament elements in parallel and two such groups of filament elements in series.

The embodiments and features shown in the figures can also be combined according to further embodiments, even if not all combinations are explicitly described. Furthermore, the embodiments shown in the figures can comprise further or alternative features as described in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

The invention claimed is:

1. A filament structure for a lighting device comprising:
at least two filament elements, each of the at least two filament elements comprising:
a leadframe element having a first end region and a second end region; and
a plurality of light-emitting diodes arranged on the leadframe element;
at least one connecting element connecting the first end region of one of the at least two filament elements to the first end region of another of the at least two filament elements so that the at least two filament elements are connected in series; and
at least one further filament element comprising a leadframe element comprising a first end region and a second end region and a plurality of light-emitting diodes,
wherein the leadframe element of the further filament element is a part of an one-piece leadframe,
wherein the first end region of the leadframe element of the further filament element is connected via the connecting element to the first end regions of the at least two filament elements,
wherein one of the at least two filament elements and the further filament element are electrically conductively connected to one another with the second end regions so that the one of the at least two filament elements and the further filament element are connected in parallel,
wherein the second end regions are connected by a further connecting element of the one-piece leadframe and/or the second end regions are connected by a connector which is separate and independent from the one-piece leadframe,
wherein the leadframe elements of all the filament elements and the at least one connecting element form the one-piece leadframe, and
wherein the connecting element is shaped and/or bendable such that each of the filament elements of the filament structure extends along a lateral surface of an imaginary cone or pyramid.

2. The filament structure according to claim 1, wherein the further filament element is connected in series with one of the at least two filament elements.

3. The filament structure according to claim 1, wherein the connector comprises a leadframe.

4. The filament structure according to claim 1, wherein the connector is stretchable in at least one direction.

5. The filament structure according to claim 4, wherein the connector comprises a stretch-lattice.

6. The filament structure according to claim 1, wherein each of the at least two filament elements is connected in parallel with the at least one further filament element.

7. The filament structure according to claim 1, wherein the filament structure has at least two connection regions between which a current path passes through the at least two filament elements during operation of the filament structure.

8. The filament structure according to claim 1, wherein the filament structure is electrically connectable via exactly two connection regions so that all filament elements are arranged along a current path between the exactly two connection regions.

9. A lighting device comprising:
at least one filament structure according to claim 1, wherein the at least one filament structure comprises an electrical connection configured to be connected to an external energy source,
wherein the at least the connecting element of the at least one filament structure is shaped and/or bent such that each of the filament elements of the filament structure extends along a lateral surface of an imaginary cone or pyramid,
wherein the cone or pyramid has a base area and an apex, and
wherein the base area faces the electrical connection and the apex faces away from the electrical connection.

10. The lighting device according to claim 9, wherein the lighting device has at least two filament structures connected to one another in series.

11. The lighting device according to claim 10, wherein the at least two filament structures are connected in series via the connector.

12. The lighting device according to claim 9, wherein the electrical connection is configured to be mounted and electrically connected in a conventional lamp socket.

13. The lighting device according to claim 9, wherein the at least one filament structure is soldered to at least one electrical supply line of the electrical connection.

14. A method comprising:
providing at least one filament structure according to claim 1;
bending and/or shaping at least the connecting element of the at least one filament structure such that each of the filament elements of the filament structure extends along a lateral surface of an imaginary cone or pyramid; and
connecting the at least one filament structure to at least one electrical supply line of an electrical connection.

15. The method according to claim 14, wherein connecting the at least one filament structure to the at least one electrical supply line comprises connecting by soldering.

* * * * *